(12) United States Patent
Wippler

(10) Patent No.: US 7,961,455 B2
(45) Date of Patent: Jun. 14, 2011

(54) DISPLAY DEVICE HAVING GUIDES LINKING BUTTONS TO DISPLAY INFORMATION

(75) Inventor: Erik Anthony Wippler, Canton, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 169 days.

(21) Appl. No.: 12/479,180

(22) Filed: Jun. 5, 2009

(65) Prior Publication Data

US 2010/0309610 A1 Dec. 9, 2010

(51) Int. Cl.
*G06F 1/16* (2006.01)

(52) U.S. Cl. ............ 361/679.02; 361/679.21; 362/516; 362/517; 359/599; 359/615

(58) Field of Classification Search ............ 361/679.02, 361/679.21
See application file for complete search history.

(56) References Cited

U.S. PATENT DOCUMENTS

| | | | |
|---|---|---|---|
| 4,874,224 A * | 10/1989 | Gutman et al. | 359/618 |
| 5,261,349 A * | 11/1993 | Iino et al. | 116/289 |
| 5,528,720 A * | 6/1996 | Winston et al. | 385/146 |
| 5,694,793 A * | 12/1997 | Nishimura et al. | 68/12.27 |
| 6,335,861 B1 * | 1/2002 | Ramsey et al. | 361/679.21 |
| 6,357,881 B1 * | 3/2002 | Robertson | 359/609 |
| 6,603,083 B2 * | 8/2003 | Amari et al. | 200/5 D |
| 7,576,915 B2 * | 8/2009 | Kurt | 359/599 |
| 7,874,689 B2 * | 1/2011 | Tane et al. | 362/23 |
| 7,876,489 B2 * | 1/2011 | Gandhi et al. | 359/242 |
| 2005/0169003 A1 * | 8/2005 | Lindahl et al. | 362/494 |
| 2008/0151531 A1 * | 6/2008 | Richardson et al. | 362/125 |

(Continued)

FOREIGN PATENT DOCUMENTS

JP 2000194484 A 7/2000

(Continued)

OTHER PUBLICATIONS

Avaya, 2400 Series Digital Telephones, www.avaya.com/gcm/master-usa/en-us/products/offers/2400_series_digital_telephon... Feb. 24, 2009.

*Primary Examiner* — Jayprakash N Gandhi
*Assistant Examiner* — Anthony Q Edwards
(74) *Attorney, Agent, or Firm* — Gifford, Krass, Sprinkle, Anderson & Citkowski, P.C.

(57) ABSTRACT

A housing for mounting a display device is provided. The display device includes a display screen capable of displaying an executable function and an input selector which corresponds to the displayed function such that upon actuation of the input selector the displayed function is executed. The housing includes a generally planar surface disposed spaced apart from the display screen. An aperture is formed in the generally planar surface so that the display screen is visible through the generally planar surface. A ledge bounding at least a portion of the aperture extends from the generally planar surface to the display screen. A guide formed on the ledge links the input selector to the displayed function. The ledge has a first reflectance and the guide has a second reflectance which is different than the first reflectance so as to provide a contrast between the ledge and the guide due to the different amounts of light emitted from the display screen reflecting off the ledge and the guide.

9 Claims, 3 Drawing Sheets

U.S. PATENT DOCUMENTS

| | | | |
|---|---|---|---|
| 2009/0046453 A1* | 2/2009 | Kramer | 362/231 |
| 2009/0168319 A1* | 7/2009 | Jeon et al. | 361/679.22 |
| 2009/0303695 A1* | 12/2009 | Buchstab et al. | 362/97.1 |
| 2010/0090962 A1* | 4/2010 | Yoo et al. | 345/170 |
| 2010/0110027 A1* | 5/2010 | Lipman et al. | 345/173 |
| 2010/0156657 A1* | 6/2010 | Lee et al. | 340/815.4 |
| 2010/0188193 A1* | 7/2010 | Uken et al. | 340/5.71 |

FOREIGN PATENT DOCUMENTS

JP   2001282410 A   10/2001

* cited by examiner

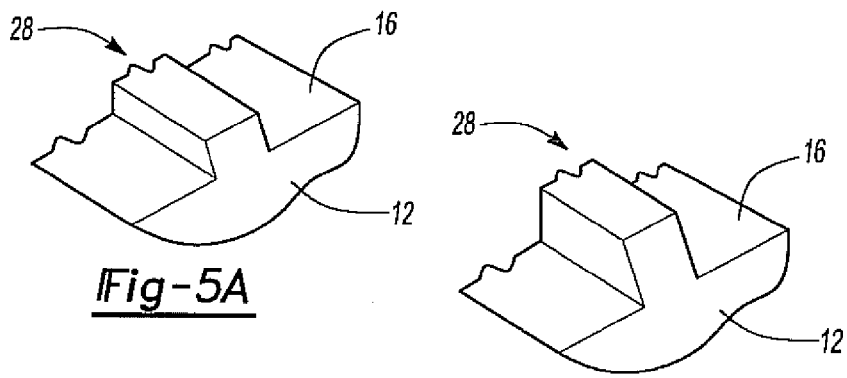
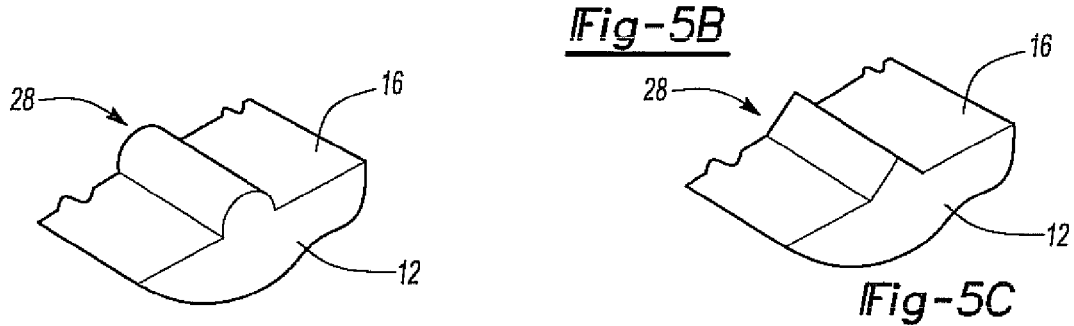
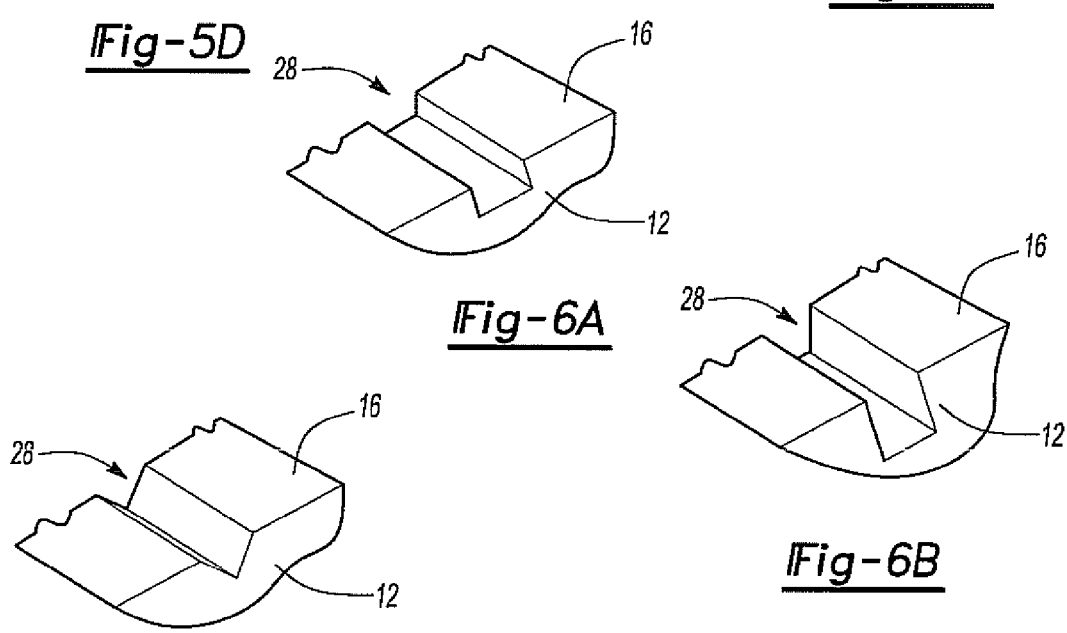
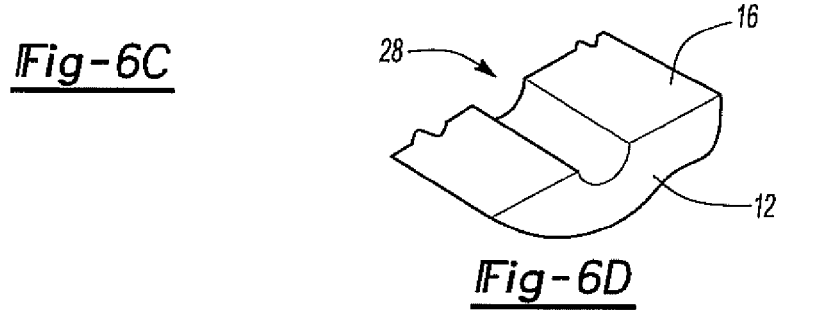

DISPLAY DEVICE HAVING GUIDES LINKING BUTTONS TO DISPLAY INFORMATION

FIELD OF THE INVENTION

The present invention relates to a display device, more particularly to a display device having guide features which link non-dedicated buttons to their function displayed on the display device.

BACKGROUND OF THE INVENTION

A vast majority of modern electronic devices implement a screen or display of some type, whether light emitting diode (LED), liquid crystal display (LCD), vacuum fluorescent display (VFD), etc., to display information regarding the device's function. As electronic devices become more advanced they are capable of performing a variety of different functions while at the same time decreasing in size. As such, many devices are moving away from the use of dedicated buttons which upon actuation will execute only the function the button is dedicated to perform.

In order to allow users to take advantage of the varied functions modern electronic devices are now capable of performing, designers are using non-dedicated buttons or soft buttons which correspond to a specific portion of the display area of the display device. The soft buttons are not dedicated to a single function; rather, the actuation of such a soft button will execute the function displayed on the specific portion of the display device. When using multiple soft buttons, the display device will have a specific portion which corresponds to each of the soft buttons.

Soft buttons and their corresponding portion of the display device are normally placed in close proximity to each other so that a user may quickly and easily link the soft button to the corresponding function on the display screen. In some circumstances, soft buttons and their corresponding portions of the display area are spaced apart The distance between the soft button and the corresponding display area usually does not affect the user's ability to link the soft button with the corresponding display area when the user is situated directly in front of the display device.

However, a problem arises when a user views the display device from an angle. If there is a significant distance between the edge of the soft button and the corresponding portion of the display area, for example a distance of 5 millimeters or more, the soft button and the corresponding portion of the display area will appear offset resulting in confusion in linking the soft buttons to their corresponding portions of the display area.

There have been several prior attempts to alleviate a user's confusion in linking a soft button to its corresponding portion of the display area. One such attempt involves marking the path from the soft button to the corresponding portion of the display area with a line or groove. However, previous attempts are rendered inadequate when the display device is used in a darkened area or when a semi-opaque cover is placed over a portion of the display device.

Thus, there exists a need for an improved display device having lines linking soft buttons to their corresponding portion of the display area.

SUMMARY OF THE INVENTION

The present invention provides an improved housing for a display device which overcomes the above-mentioned disadvantages of the previously known attempts to link soft buttons to their corresponding portions of the display area.

In brief, a housing for mounting a display device is provided. The display device includes a display screen capable of displaying an executable function and an input selector which corresponds to the displayed function. The housing includes a generally planar surface disposed spaced apart from the display screen. An aperture is formed in the generally planar surface so that the display screen is visible through the generally planar surface. A ledge extends between the display and the generally planar surface. A guide formed on the ledge links the input selector to the displayed function. The ledge has a first reflectance and the guide has a second reflectance which is different than the first reflectance so as to provide a contrast between the ledge and the guide due to the different amounts of light emitted from the display screen reflecting off the ledge and the guide.

In this manner, the ledge and the guide reflect different amounts of light emitted from the display screen thereby providing a contrast between the two which allows a user to quickly and easily link the input selector with its corresponding function displayed on the display screen.

BRIEF DESCRIPTION OF THE DRAWINGS

FIGS. 5A-5D are cross-sectional views illustrating the various rib profiles; and FIGS. 6A-6D are cross-sectional views illustrating the various groove profiles.

DETAILED DESCRIPTION OF THE INVENTION

The present invention has utility as a housing for mounting a display device which overcomes the above-mentioned disadvantages. By using guide features having a reflectance different than the reflectance of the ledge on which the guide features are formed allows a user to quickly and easily link a button to the corresponding portion of the display screen displaying the function of the button. Further, as the ledge and the guide features are, optionally, formed integral with the housing there are no additional parts or assembly steps required, thereby increasing the functionality of the housing without increasing labor time or costs.

Figure 1:
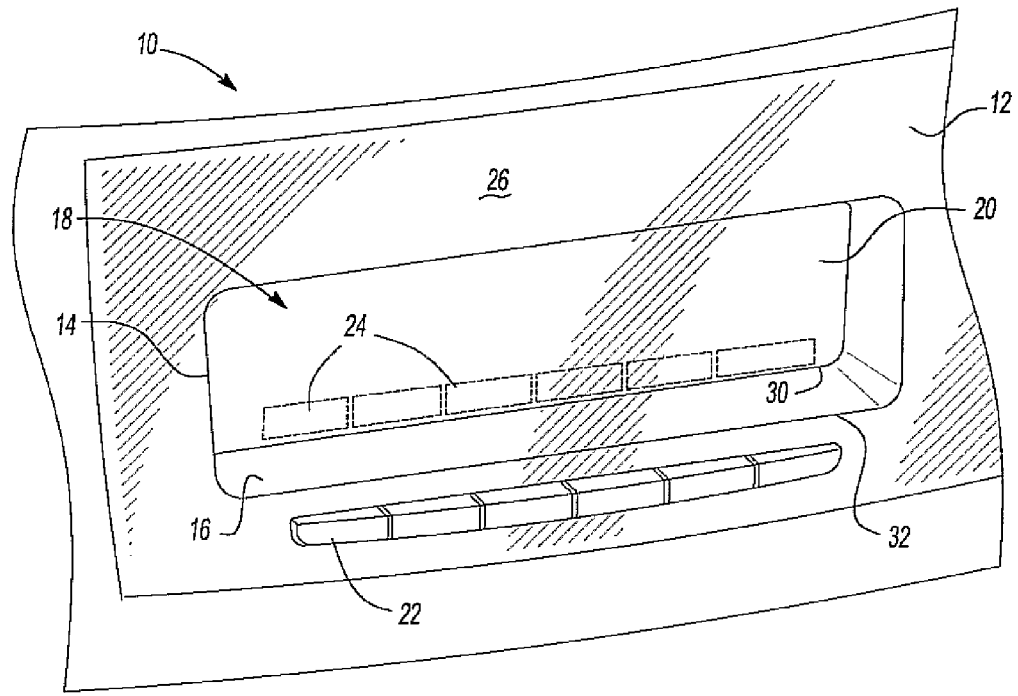
FIG. 1 is a front perspective view illustrating a housing for mounting a display device without any guide features.

With reference to FIG. 1 a housing for mounting a display device is generally illustrated at 10. The illustrated housing 10 is designed for mounting an automotive radio/GPS system. It will be appreciated that the present invention is not limited to use with automotive radio/GPS systems and can be used in a variety of different applications utilizing display screens and soft buttons.

The housing 10 includes a generally planar outer surface 12 having an aperture 14 formed therein. A ledge 16 bounds at least a portion of the aperture 14 and extends transversely from the generally planar surface 12.

A display device 18 having a display screen 20 is mounted in the housing 10 so that the display screen 20 is visible through the aperture 14. A portion of the ledge 16 abuts the display screen 20 such that the display screen 20 is spaced apart from the generally planar outer surface 12.

Several control buttons 22 are operatively connected to the display device 18. The control buttons 22 are non-dedicated buttons, or soft buttons, having no permanent function. Rather, the functions of the control buttons 22 are displayed on several function areas 24 on the display screen 20. Each of the control buttons 22 correspond to one of the function areas 24 displayed on the display screen 20 such that actuation of one of the control buttons 22 executes the function displayed on the corresponding function area 24 on the display screen 20. A lens 26, either transparent or semi-opaque covers the aperture 14, and consequently the display screen 20, and at least a portion of the generally planar surface 12. The control buttons 22, as depicted in the Figures, extend outwardly through a slot formed in the lens 26.

However, as the display screen 20 is spaced apart from the generally planar surface 12 by the length of the ledge 16, the control buttons 22 are distanced from the function areas 24. The distance between the control buttons 22 and the function areas 24 makes it difficult to link the control buttons 22 to their function areas 24 when viewed from an angle.

Figure 2:
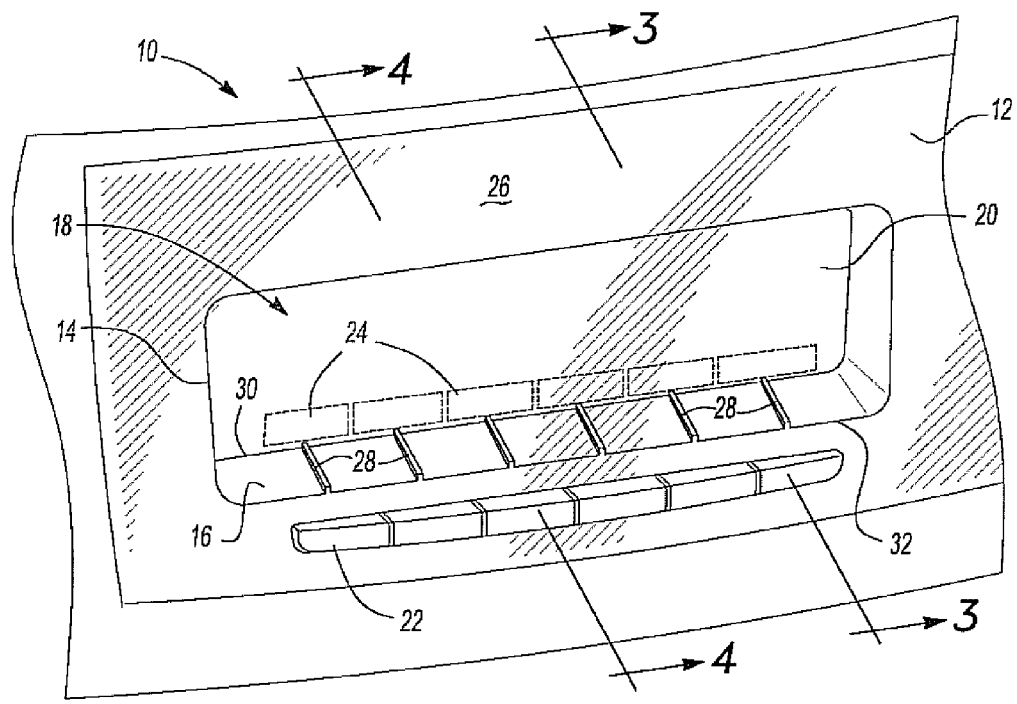
FIG. 2 is a front perspective view illustrating a housing for mounting a display device having guide features.

FIG. 2 illustrates an embodiment of the inventive housing 10 having guide features to link the function areas 24 to the corresponding control buttons 22. The guide features are formed as a plurality of guides 28 which link the function areas 24 to their corresponding control buttons 22. The guides 28 are formed on the ledge 16 and extend at least a portion of the distance between the distal end 30 of the ledge 16, which is adjacent to the display screen 20, to the proximate end 32 of the ledge 16 which is adjacent to the generally planar outer surface 12. Optionally, the guides 28 may be molded integrally with the ledge 16 so as to reduce the number of parts of the housing In order to provide a contrast between the guides 28 and the ledge 16 when the housing 10 is covered at least partially by the semi-opaque lens 26 or when the housing 10 is used in a darkened environment, the guides 28 and the ledge 16 are provided with a differing reflectance. The reflectance of the guides 28 and ledge 16 affect the amount of light emitted from the display screen 20 which is reflected to the user by the guides 28 and ledge 16. By providing the guides 28 and the ledge 16 with a differing reflectance, the amount of light emitted by the display screen which is reflected off the guides 28 and the ledge 16, in the direction of the user, will also be different. Therefore, a contrast is provided between the guides 28 and the ledge 16 allowing a user, even if viewing from an angle, the ability to quickly and easily link the function areas 24 to the control buttons 22.

It is preferred that the guides 28 have a reflectance which allows more light to be reflected so that a lighted guide path links the function area 24 to its corresponding control buttons 22. However, the housing 10 functions effectively even if the ledge 16 has a reflectance which allows for more light to be reflected than the guides 28.

The guides 28, optionally, are formed as either a groove or a rib extending from the distal end 30 to the proximate end 32 of the ledge 16 to extenuate the contrast in reflected light due to the differing surface treatment. As seen in FIGS. 5A-5D and in FIGS. 6A-6D, the guides are formed as ribs and grooves, respectively, in a variety of different shapes. It will be appreciated that the illustrated shapes of the grooves and the ribs are non-limiting and the grooves and ribs may be formed in any other appropriate shape.

Figure 3:
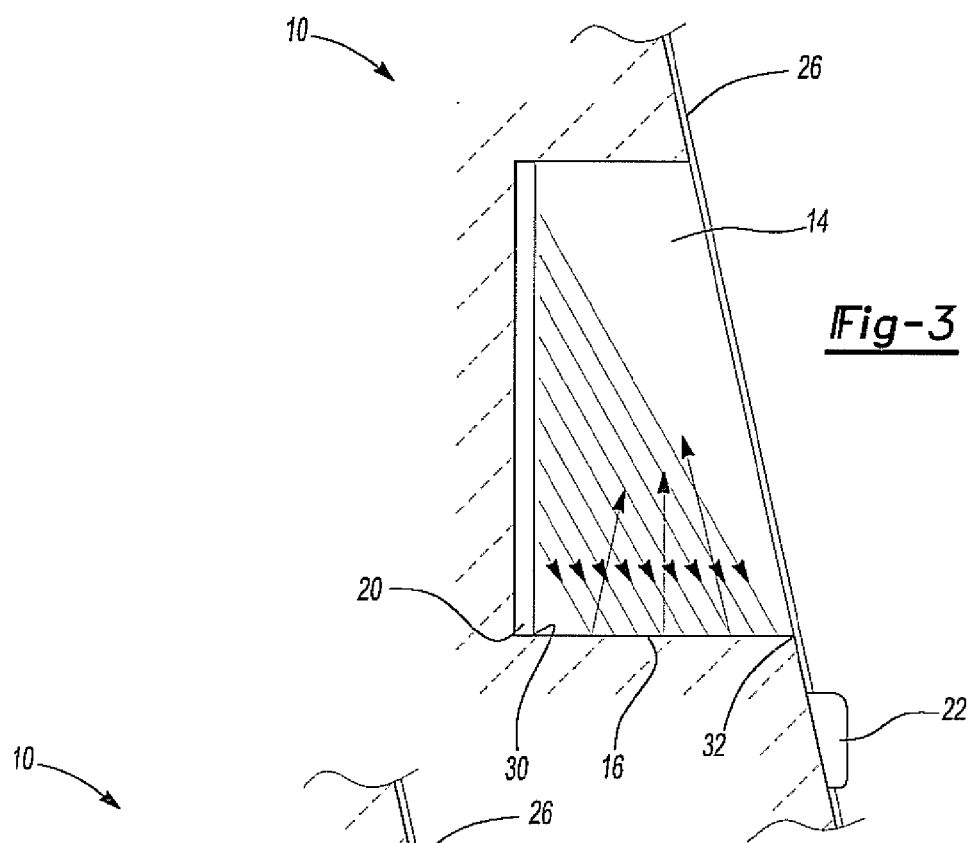
FIG. 3 is a cross-sectional view taken along the line 3-3 in FIG. 2 illustrating light emitted from the display screen reflecting off the ledge.
Figure 4:
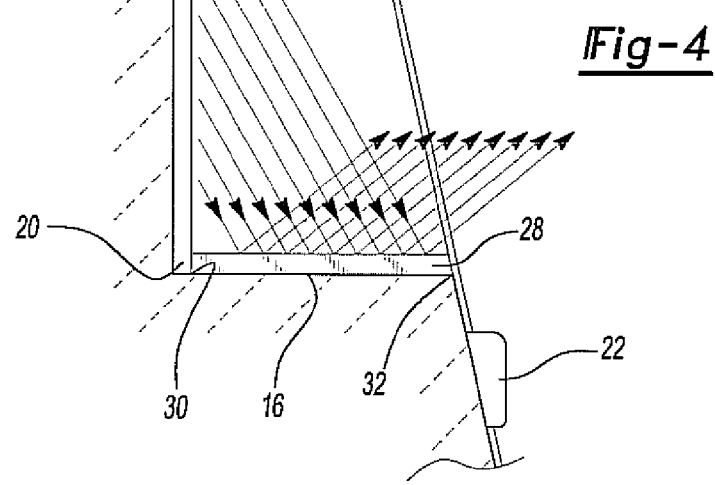
FIG. 4 is a cross-sectional view taken along the line 4-4 in FIG. 2 illustrating light emitted from the display screen reflecting off the guide.

In order to vary the reflectance of the guides 28 and the ledge 16, a number of different surface treatments may be used. One such surface treatment involves varying the surface texture of the ledge 16 and the guides 28. In such an embodiment, the ledge 16 is provided with a rough, uneven or granular surface texture such that the light emitted from the display screen 20 undergoes diffuse reflection and is reflected in varying directions and in varying angles, as seen in FIG. 3. The guides 28 are provided with a smooth, even or polished surface such that the light emitted from the display screen 20 undergoes specular reflection and is reflected in a uniform manner as seen in FIG. 4. As the guides 28 reflect more light in a direction towards the user than the ledge 16, the guides 28 will be contrasted from the ledges 16.

In this embodiment the guides 28 may be formed as grooves or ribs having smooth walls. In the alternative, the guides 28 may be formed by merely providing a portion of the ledge 16 extending from the distal end 30 to the proximate end 32 as a smooth surface with the remaining portion of the ledge 16 being a rough surface.

Other forms of varying the surface treatment of the ledge 16 and the guides 28 to provide contrasting amounts of reflection include coating the ledge 16 with a matte paint and coating the guides 28 with a paint having a glossy finish, or forming the ledge 16 and the guides 28 out of differing materials having differing reflectance.

It will be appreciated that the various ways of differing the surface treatment may be used in combination such that the ledge 16 is formed with a rough surface texture, and the guide 28 is formed having a smooth texture and being coated with a glossy paint. Optionally, the guides 28 are formed as either a groove or a rib in addition to the various ways of differing the surface treatment. For example, providing the ledge 16 with a rough surface texture and having a guide 28 formed as a rectangular rib having smooth walls which are covered with a paint having a glossy finish.

In an alternative embodiment, the guides 28 are formed of a light transmitting material illustratively including a clear plastic. A portion of the guides 28 adjacent the distal end 30 of the ledge 16 is positioned to abut or be in close proximity to the display screen 20 so that light emitted from the display screen 20 enters the light transmitting material and travels throughout to illuminate a lighted path providing from the function areas 24 to the control buttons 22. Optionally, the light transmitting material is formed as a rib, or fills in the space formed by a groove so that the guides 28 are flush with the ledge 16.

Further, it will be appreciated that the control buttons 22 are not limited to push buttons and include any type of input selector, illustratively includes switches, knobs, dials, or any other type of device for selecting a desired function.

From the foregoing, it can be seen that the present invention provides a housing for mounting a display device having guides 28 to visually link the display area 24 to their corresponding control button 22 by providing a contrast in the amount of light emitted from the display screen 20 which is reflected by the guide and the ledge 16. Having described my invention, however, many modifications thereto will become apparent to those of ordinary skill in the art to which it pertains without deviation from the spirit of the invention as defined by the scope of the appended claims.

It is claimed:

1. A display housing for mounting a display having a display screen capable of displaying at least one function, and at least one input selector corresponding to the at least one function, said housing comprising:

a generally planar surface disposed spaced apart from the display screen;

an aperture formed in said generally planar surface, said aperture dimensioned to receive the display screen;

a ledge extending between the display screen and said generally planar surface, said ledge having a first reflectance; and at least one guide disposed on said ledge to link the at least one input selector to the at least one function displayed on the display screen, said at least one guide having a second reflectance;

said first reflectance being different from said second reflectance so that said first reflectance reflects a different amount of emitted light than said second reflectance to contrast said ledge from said at least one guide to provide a visual link between the at least one input selector and the at least one function displayed on the display screen.

2. The housing of claim 1, wherein said at least one guide extends from a proximate end of said ledge to a distal end of said ledge.

3. The housing of claim 1, wherein said at least one guide is a groove disposed in said ledge.

4. The housing of claim 1, wherein said at least one guide is an elongated rib extending outwardly from said ledge.

5. The housing of claim 1, wherein said ledge is formed of a first material and said at least one guide is formed of a second material so as to differentiate said first reflectance from said second reflectance.

6. The housing of claim 1, wherein said ledge has a first surface texture and said at least one guide has a second surface texture so as to differentiate said first reflectance from said second reflectance.

7. The housing of claim 1, wherein one of said ledge or said at least one guide has a surface coating so as to differentiate said first reflectance from said second reflectance.

8. The housing of claim 1, furthercomprising a semi-opaque lens covering said aperture and at least a portion of said generally planar surface area.

9. The housing of claim 1, wherein said at least one guide is composed of a light transmitting material.

* * * * *

UNITED STATES PATENT AND TRADEMARK OFFICE
CERTIFICATE OF CORRECTION

| | | |
|---|---|---|
| PATENT NO. | : 7,961,455 B2 | Page 1 of 1 |
| APPLICATION NO. | : 12/479180 | |
| DATED | : June 14, 2011 | |
| INVENTOR(S) | : Erik Anthony Wippler | |

It is certified that error appears in the above-identified patent and that said Letters Patent is hereby corrected as shown below:

Column 1, Line 39, Replace "apart" and insert --apart.--

Column 3, Line 34, Replace "housing" with --housing.--

Signed and Sealed this

Sixth Day of December, 2011

David J. Kappos
*Director of the United States Patent and Trademark Office*